(12) United States Patent
Nielsen et al.

(10) Patent No.: US 7,321,262 B2
(45) Date of Patent: Jan. 22, 2008

(54) POWER CONVERSION SYSTEM

(75) Inventors: Karsten Nielsen, Helsingor (DK); Lars Michael Fenger, Glostrup (DK)

(73) Assignee: Bang & Olufsen Icepower A/S, Lyngby (DK)

( * ) Notice: Subject to any disclaimer, the term of this patent is extended or adjusted under 35 U.S.C. 154(b) by 0 days.

(21) Appl. No.: 10/570,324

(22) PCT Filed: Oct. 7, 2004

(86) PCT No.: PCT/IB2004/003267

§ 371 (c)(1),
(2), (4) Date: Sep. 29, 2006

(87) PCT Pub. No.: WO2005/036731

PCT Pub. Date: Apr. 21, 2005

(65) Prior Publication Data

US 2007/0109044 A1 May 17, 2007

(30) Foreign Application Priority Data

Oct. 9, 2003 (SE) .................................. 0302681

(51) Int. Cl.
*H03F 3/38* (2006.01)
(52) U.S. Cl. ..................... 330/10; 330/251; 330/207 A
(58) Field of Classification Search .................. 330/10, 330/251, 207 A
See application file for complete search history.

(56) References Cited

U.S. PATENT DOCUMENTS

| 3,900,823 | A | 8/1975 | Sokal et al. | |
| 5,075,634 | A * | 12/1991 | French | 330/146 |
| 5,898,340 | A | 4/1999 | Chatterjee et al. | |
| 6,373,340 | B1 | 4/2002 | Shashoua | |
| 6,496,059 | B1 | 12/2002 | Nguyen | |
| 6,636,112 | B1 * | 10/2003 | McCune | 330/10 |
| 6,816,016 | B2 * | 11/2004 | Sander et al. | 330/295 |
| 6,853,242 | B2 * | 2/2005 | Melanson et al. | 330/10 |
| 2005/0212592 | A1 * | 9/2005 | Hida et al. | 330/10 |

FOREIGN PATENT DOCUMENTS

| WO | WO 9515612 A1 | 6/1995 |
| WO | WO 0070754 A1 | 11/2000 |
| WO | WO 03/055059 A1 | 7/2003 |

* cited by examiner

Primary Examiner—Patricia Nguyen
(74) Attorney, Agent, or Firm—Harness, Dickey & Pierce, P.L.C.

(57) ABSTRACT

A power conversion system comprising at least one Pulse Modulated Amplifier (1), including a pulse modulator for generating a pulse modulated signal based on a reference input ($v_i$), a switching power stage arranged to amplify the pulse modulated signal, and a control system arranged to compensate for power supply voltage variations, and a voltage supply (2) providing drive voltage ($V_s$) to each amplifier, wherein said voltage supply (2) is provided with said input reference ($v_i$), and arranged to provide a first drive voltage component ($V_s$) tracking an amplified absolute value of the input reference ($v_i$). Pulse area modulation according to the invention will result in improved efficiency and at the same time ensure lower levels of EMI, as the mean amplitude of the PAM signal is lowered.

15 Claims, 7 Drawing Sheets

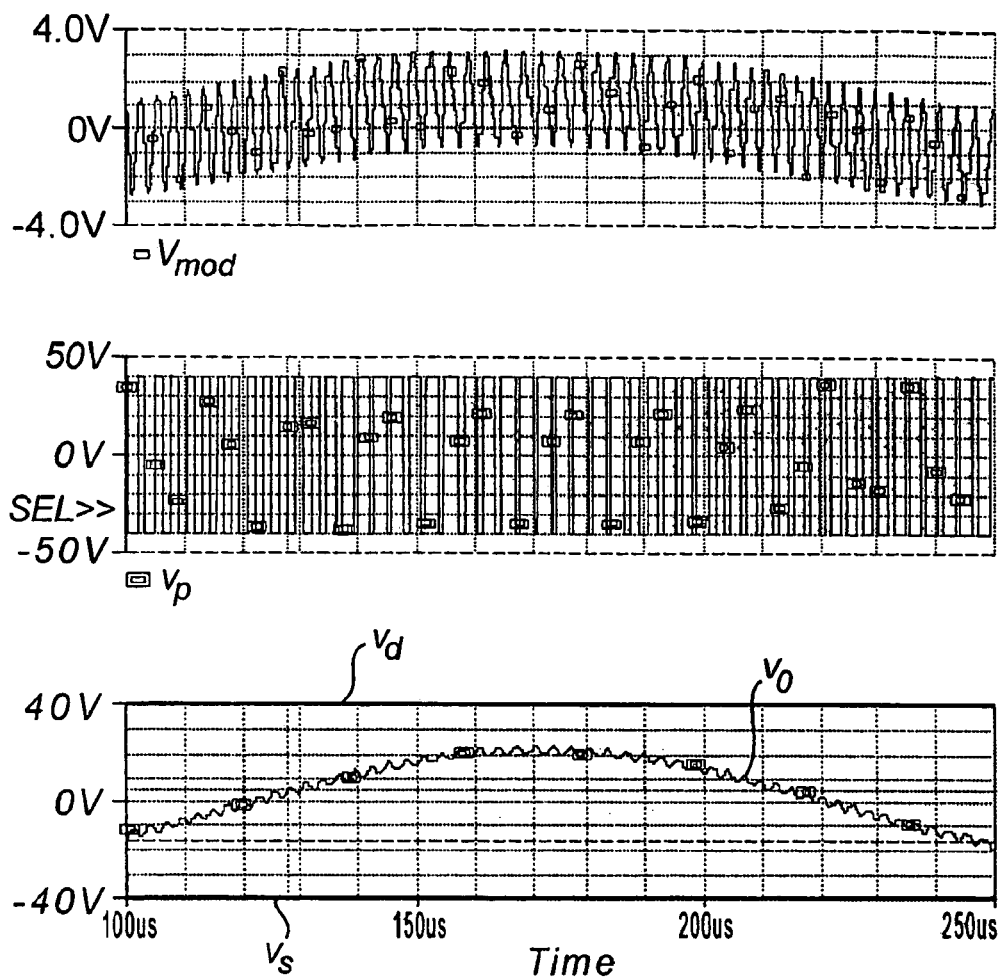
(Prior art) *Fig. 9*
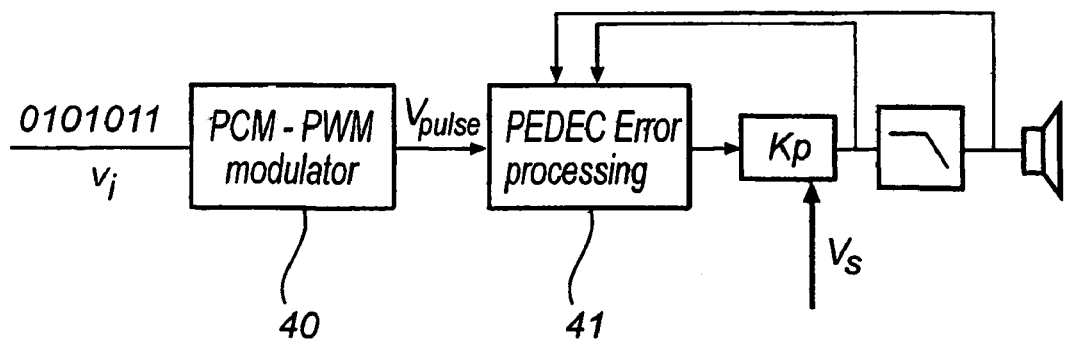
*Fig. 10*

POWER CONVERSION SYSTEM

TECHNICAL FIELD

This invention relates to a switching power conversion system such as DC-AC, DC-DC or AC-AC conversion systems or any combination of the above mentioned. More specifically, the invention relates to signal modulation of a combined amplitude- and pulse power generator obtaining a Pulse Amplitude Modulation.

The invention may advantageously be used for improved power conversion, in particular for high precision DC-AC power conversion systems such as high efficiency audio amplification.

TECHNICAL BACKGROUND

A DC-DC converter is a central element in any audio power conversion system. Many audio power conversion systems are based on Pulse Modulated Amplifiers (PMA's) operating from fixed DC's typically of a relatively high voltage, in order to be able to reproduce the maximal undistorted output power.

A general problem in such a switching output power stage is the Electro Magnetic Compatibility (EMC), caused by the generally high amplitude of the power stage output PWM signal. This implies high levels of EMI from the switching power stage and associated circuitry, that generally require filtering on all interface terminals and maybe shielding. This increases system cost, and complicates the development and approval of such systems.

A general Pulse Modulated Amplifier (PMA) operating from a high supply voltage will also create pop-noise when turned on. The pop-noise level is proportional to the amplitude of the supply voltage, which implies high levels of pop-noise in most commercial PMA's.

Further, in a conventional PMA, the modulation depth duty cycle is lower at attenuated levels of the input signal, implying that the amplitude of the demodulated signal (i.e. the low pass filtered amplifier output) will be low, compared to the amplitude of the power stage output pulse signal. The efficiency of a power stage generally declines when the duty cycle is lowered. This effect is a result of a decreasing ratio between the amplitude of the demodulated output signal and the amplitude of the power stage output PWM signal.

A higher duty cycle combined with lower amplitude of the PWM signal can retain the same demodulated signal, but will increase the efficiency, lower EMI related problems, and improve the dynamic range at low modulation indexes.

A system capable of changing the DC level is shown in the applicant's international patent application WO03/055059, entitled "Attenuation control for digital power converters".

Another digital amplifier system including attenuation control is described in U.S. Pat. No. 5,898,340. However, this system includes a complex power stage voltage supply, with an output voltage variable in a wide range. A system without any control system applied to the amplifier will require a linear power supply making it very complex and expensive. The mentioned system also includes A/D conversion means in the feedback path from the analog output. This will increase the complexity and further limit the performance of the system.

OBJECTS OF THE INVENTION

Accordingly, a primary object of the invention is to provide an improved modulation technique which reduces the above mentioned problems.

A second object is to provide a PMA with an improved Power Supply Rejection Ratio, in order to drive the power supply at a large-scale voltage variance level.

A third object of the invention is to provide a PMA with improved linearity (Total Harmonic Distortion+noise, THD+n).

A fourth object of the invention is to provide a PMA with increased efficiency at attenuated levels of the power stage output signal where the system is most frequently operated.

A fifth object of the invention is to provide a PMA with less pop-noise distortion.

SUMMARY OF THE INVENTION

These and other objects are achieved with a system comprising a power supply and a single or a plurality of PMA's of the kind mentioned by way of introduction, wherein voltage supply is provided with said input reference ($v_i$), and arranged to provide a first drive voltage component tracking an amplified absolute value of the input reference.

The term "tracking" is intended to comprise any drive signal variation essentially following the variations of the (rectified) input reference, possibly with an additional headroom. Depending on the design of the voltage supply, the tracking can be more or less exact, but the present invention is intended to cover also such imperfect "tracking", as will be clear from the detailed description below.

As the drive voltage impacts directly on the gain of the switching stage, this serves to minimize the voltage difference $V_{diff}$ between the maximum voltage output of the PMA and the drive voltage.

According to the invention, the output signal of the PMA switching power stage is modulated both in amplitude, due to the variable drive voltage from the voltage supply, and in pulse duration due to the pulse modulation in the PMA. This implies that the pulse area and thereby the pulse energy is controlled, and such modulation can be referred to as pulse area modulation (PAM).

Larger duty cycle variations in the switching power stage can be used for compensating any non-linearities in the voltage supply or in the PMA than compared to prior art.

PAM modulation according to the invention will result in improved efficiency and at the same time ensure lower levels of EMI, as the mean amplitude of the PAM signal is lowered.

Switching losses in the amplifier related to MOSFET parasitic capacitances $C_{DS}$, $C_{GD}$ and $C_{GS}$ will be reduced due to the lowering of the drive voltage. The switching power loss in the PMA switching stage is proportional to the squared drive voltage. This implies that a five times lower drive voltage will result in approximately 25 times lower switching losses.

Problems related to EMI will be greatly reduced also due to lowering of ripple currents, lowering of shoot-through currents and reverse recovery currents in the intrinsic diode of the MOSFET's in the switching stage.

The linearity of the amplifier is improved, by attenuating noise/distortion due to inaccuracy in the rising and trailing edges of the pulse waveforms in the pulse modulated signal. This is due to the relative lower pulse area contribution by inaccuracy of the rising and trailing edges of the pulse width modulation, when the duty-cycles of the PWM signal are increased.

When the amplifier is running at idle the power supply drive voltage is low, implying that pop-noise will be reduced significantly due to the proportionality between pop-noise level and power supply drive voltage.

The voltage supply according to the invention tracks a signal comparable to the amplifier output signal. In order not to create large-scale distortion, the amplifier should have a very high Power Supply Rejection Ratio (PSRR). A high PSRR is obtained by applying a control system to the PMA. The control system can in principle be any kind of control system.

In the case of a PMA comprising an analog modulator said control system can preferably be a self-oscillating control system such as a Controlled Oscillation Modulator control system as described in the applicant's patent "Pulse Modulation Power Amplifier with Enhanced Cascaded control method" with international publication number WO98/19391, herewith incorporated by reference. In this case, all harmonics of the carrier in the PMA are proportional to the drive voltage, hence they will be lowered proportional to the mean amplitude of the PAM signal.

In the case of the PMA comprising a digital PCM-PWM modulation the control system is preferably a PEDEC system as described in the applicant's patent with international publication number WO98/44626, herewith incorporated by reference.

The pulse modulation is preferably a pulse width modulation, in which case the output is a Pulse Amplitude Width Modulated (PAWM) signal, which is a special case of the PAM modulation. The skilled man will see that any kind of pulse modulation can be used, such as Pulse density modulation (PDM), Pulse Position Modulation (PPM), or any other pulse modulation scheme known to the man skilled in the art.

According to one embodiment, the first drive voltage component is equal to $k*|v_i|+\Delta$, where k is a constant and $\Delta$ is a fixed headroom. This provides an advantageous example of the intended tracking. In some case it may be advantageous to have the voltage supply arranged in such a way that the headroom $\Delta$ increases when the power supply has to deliver a drive voltage with a negative $$\frac{dV}{dt}.$$

When several PMA's are implemented in the system, indicating several input references, the maximum can be used in the above equation.

According to a different embodiment, the drive voltage is controlled by a peak-detection of the output signal $V_o$ of the PMA, said peak detection preferably generated by volume control information. This results in a piece-wise constant drive voltage, tracking the current peak level of the output signal.

The PMA can be balanced, and driven by a single drive voltage as described above. Alternatively, the voltage supply can be adapted to provide a second drive voltage component equal to the inverse of the first component. Such a dual drive voltage can be used to drive a single ended PMA. Operating the voltage supply in this way will secure lowering of system EMI problems, overall system complexity and higher system efficiency.

The PAWM signal can comprise a 2-level PWM signal generated from the pulse modulator, and at the same time can have PMA power stage ripple currents and output residual HF voltages proportional to the modulation index/signal input level. Due to the lowering of the ripple current at low modulation indexes, this will create low idle losses in the PMA load, or output filter if one is applied. This is an advantage particularly when driving a transducer directly from the switching stage output, where HF ripple currents generated by the output stage switching voltage will create losses in the transducer.

The voltage supply can comprise means for sinking current, to enable a sufficiently negative $$\frac{dv}{dt}$$

on the power supply drive voltage.

The conversion system is advantageously implemented as a class D system.

BRIEF DESCRIPTION OF THE DRAWINGS

Preferred embodiments of the present invention will be further described in the following, with reference to the appended drawings.

FIG. 9 shows the simulation graphs of a typical prior art PWM system operating from DC supply.

FIG. 10 shows a preferred embodiment as a PMA comprising PCM-P=WM means.

DETAILED DESCRIPTION OF THE PREFERRED EMBODIMENTS

Figure 1:
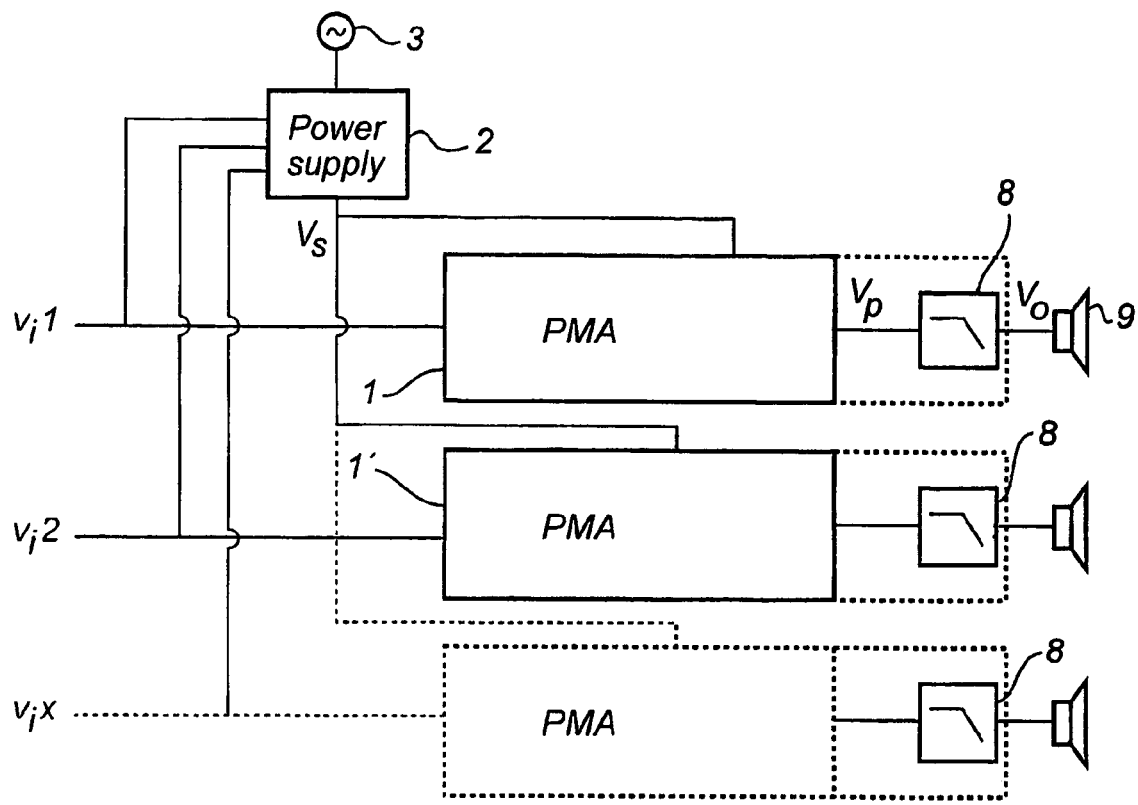
FIG. 1 illustrates a block diagram of a first embodiment of the invention.

A first embodiment of the invention is shown in FIG. 1, and comprises multiple PMA's 1, 1', and a voltage supply 2. The reference input signal $v_i$ is connected to the input of the PMA and to the variable voltage supply, which also is connected to the mains 3 or any other form of power source.

Figure 2:
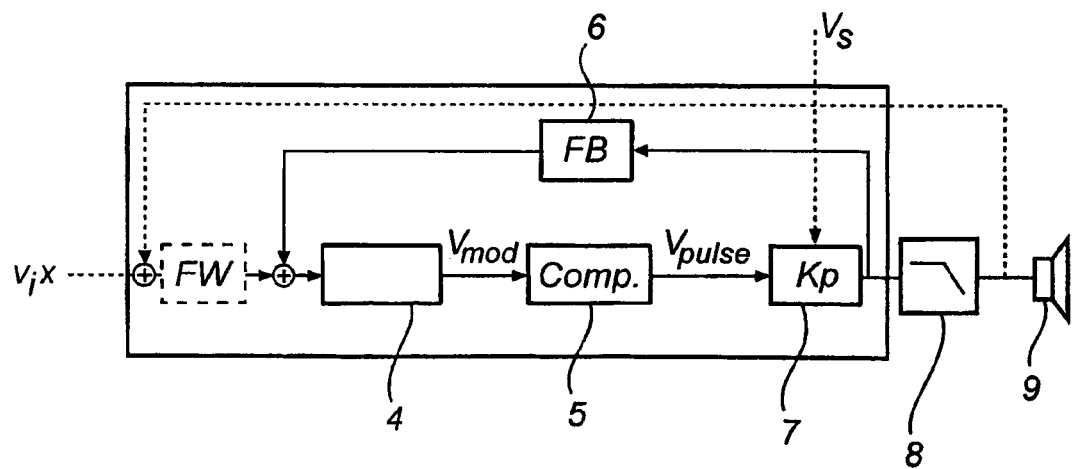
FIG. 2 shows an embodiment of the PMA in FIG. 1.

One example of the PMA's in FIG. 1 are shown in FIG. 2, comprising a control block 4, a comparator 5, a feedback block 6 and a switching power stage 7. The control block 4 has a transfer function cooperating with the feedback block 6 to secure self-oscillation. The PMA in FIG. 2 is based on a self-oscillating modulator such as, but not limited to, the Controlled Oscillation Modulator (COM) described in the applicant's international patent application WO98/19391, herewith incorporated by reference. Other self-oscillating principles can be used based on integrators, hysteresis or non-hysteresis control or any other self-oscillating modulator principle obvious to the skilled man.

In fact, the pulse modulation is not limited to pulse width modulation, but any kind of pulse modulation can be used, such as Pulse density modulation (PDM), Pulse Position Modulation (PPM), or any other pulse modulation scheme known to the man skilled in the art.

When a COM modulator is comprised in the PMA, the following will apply:

$$V_o = \frac{V_s}{V_{mod}} \cdot V_i = A \cdot V_i,$$

where $V_o$ is the output voltage of the switching stage 7, $V_i$ is the input reference signal to the PMA, $V_s$ is the drive voltage from the power supply, $V_{mod}$ is the input signal to the comparator 5 and A is the power stage gain.

The voltage $V_{mod}$ will vary proportional in amplitude with the power stage voltage due to the controlled instability of the COM modulator, and therefore the power stage gain will be retained (A will be constant). A fixed power stage gain will imply infinite PSRR, and a PMA comprising a COM modulator can therefore in theory obtain infinite PSRR. Therefore distortion will not be created on the output of the PMA.

As indicated in FIG. 1, the power supply can drive a plurality of PMAs 1, 1'.

In FIG. 2, the output from the PMA switching power stage is connected to a demodulation filter 8, which is connected to a load 9, such as a transducer (loudspeaker). Alternatively (not shown), the switching stage output is connected directly to or fully integrated into a transducer, according to the "pulse modulated transducer" principle, described in WO02/093973, herewith incorporated by reference.

The power supply will supply, the necessary drive voltage $V_s$ to the switching stage 7 in each of the PMA's shown in FIG. 1, based on the input voltage $v_i$. The voltage supply must be capable of delivering a varying voltage $V_s$ within the range of:

$$V_s = [\Delta; V_{o,max} + \Delta] = [\Delta; A \cdot V_i + \Delta],$$

where $V_{o,max}$ is the desired maximum output voltage of the PMA switching power stage equivalent to $A \cdot V_i$, and $\Delta$ is an optional headroom. The value $\Delta$ may be time variant, and even negative in the case that the PMA is based on a Boost topology (see below).

The power supply should deliver voltage headroom to the maximum peak output voltage $V_{o,max}$ of any of the PMA's shown in FIG. 1.

When the PMA(s) is/are balanced, and driven by a single varying drive voltage, this voltage can be determined by the following expression:

$$V_s = A \cdot \max(|v_{ix}|) + \Delta \quad (1),$$

where $v_{ix}$ are the different PMA input references as shown in FIG. 1 and A is the power stage gain.

A first example of a voltage supply implementation is shown in FIG. 2, as a non-galvanic isolated Buck converter for implementation in isolated systems, e.g. an isolated speaker, or in battery powered systems.

The circuit comprises a MOSFET 10, having its gate 11 connected to the pulse modulated input voltage, its source 12 connected to the first side 13 of the output terminal via a coil 14, and its drain 15 connected to one side 16 of the rectified mains 5. The other side 17 of the rectified mains is connected to the second side 18 of the output terminal. To this second output side 18 there is further connected a capacitor 19 to the MOSFET drain 15 and a diode 20 to the MOSFET source 12. Finally, an output capacitor 21 bridges the first and second sides 13, 18 of the output terminal.

The output capacitance of the power supply is preferably sufficiently small that the equivalent load resistance $R_a$ of the amplifier switching stage will be capable of discharging the power supply output capacitance $C_o$ so fast that the $R_a C_o$ time constant allows a low enough negative $$\frac{dV}{dt}$$

to deliver the voltage as described in eq. 1. In some cases the headroom $\Delta$ will be constant when the pulse generator delivers a voltage with a negative $$\frac{dV}{dt}.$$

Figure 5A:
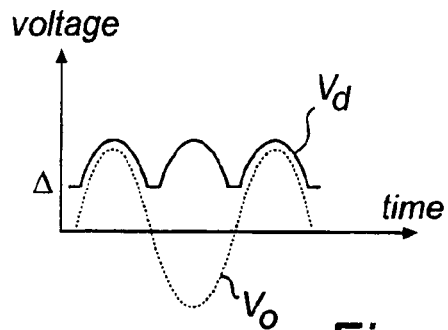
FIG. 5a-5d illustrates different examples of input drive voltages generated by the voltage supply in FIG. 1.

This will result in a drive voltage according to eq. 1, as shown in FIG. 5*a*.

Figure 3:
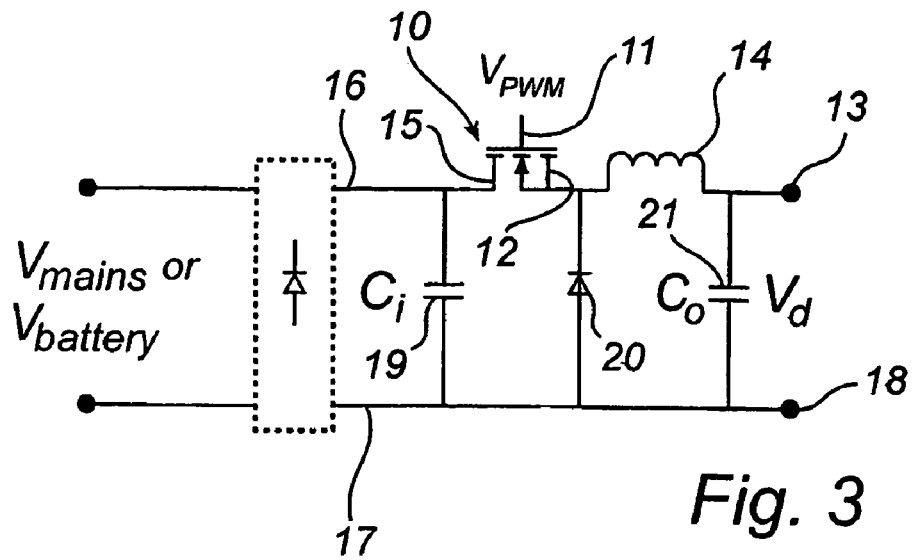
FIG. 3 shows an embodiment of the voltage supply in FIG. 1.

However, when a large capacitance 21 is placed on the output of the power supply in FIG. 3, the power supply will not be capable of sinking the current from the capacitance. Therefore it will not capable of delivering the necessary negative $$\frac{dV}{dt}$$

on the output voltage $V_d$. In other words it can be the case that the converter cannot track the PMA output signal on the two quarters of a period of the sinusoid signal, where the power supply voltage $V_s$ has a negative $$\frac{dV}{dt}.$$

Figure 5B:
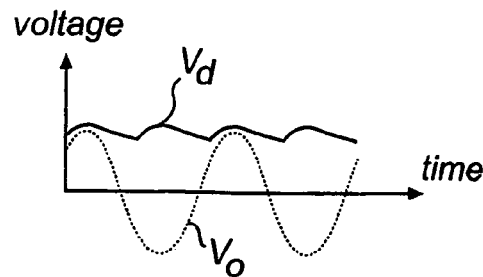

This will result in a drive voltage according to FIG. 5*b*.

Figure 4:
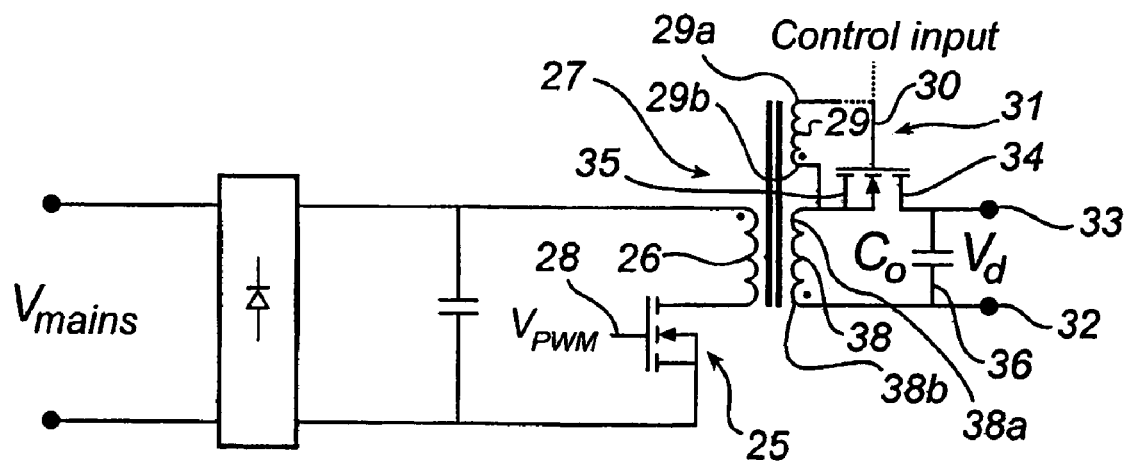
FIG. 4 shows a further embodiment of the voltage supply in FIG. 1.

A second example of the voltage supply, more suitable for large output capacitances, is shown in FIG. 4. The topology is fly-back derived, and can comprise a galvanic isolation.

This circuit comprises a MOSFET 25, connected in series with the primary winding 26 of a transformer 27 between the two sides of the rectified mains 5. The modulated input voltage is connected to the gate 28 of the primary side MOSFET 25. A first secondary winding 29 of the transformer 26 is connected in one end 29*a* to the gate 30 of a secondary side MOSFET 31. Another secondary winding 38 is connected in one end 38*b* to a first side 32 of the output terminal. The second side 33 of the output terminal is connected to the drain 34 of the MOSFET, while the source 35 of the MOSFET is connected to the other ends 29*b*, 38*a* of the two secondary side windings 29, 38. Again, an output capacitor 36 bridges the first and second sides 32,33 of the output terminal.

Further, a control input 37 is connected to the MOSFET gate 30. The MOSFET 31 acts as an active diode when the MOSFET 25 is turned on by pulses induced when the MOSFET 25 is turned on. Furthermore the MOSFET 31 enables the sinking of current from the output terminal 33 during the transformer voltage-reversing period when the MOSFET 25 is turned off.

The voltage supply in FIG. 4 will be capable of sinking current, and can therefore create a lower negative $$\frac{dV}{dt}.$$

The circuit in FIG. 4 also has the advantage that the diode voltage drop of the usual secondary forward path diode (20 in FIG. 2) is eliminated due to the additional active MOSFET 31. This will increase the efficiency at high current output amplitudes of the power supply.

The skilled man realizes that any topology capable of "Bucking" (reducing the converter output voltage with respect to the converter input voltage) can be used. Other topologies like forward, push-pull, CUK, Sephic or any other converter types of the Buck family can be used for "Bucking".

In the case of low supply voltage PAM system such as some battery driven systems the power supply can be implemented as a Boost topology (not shown). Thereby the output voltage of the PAM system can exceed that of the supply voltage of the voltage supply. Topologies like Boost, Push Pull or any other converter type known to the skilled man capable of "Boosting" can be used as a voltage supply.

When the PMA(s) is/are single ended and driven by a dual drive voltage, this voltage can be determined as:
Positive supply voltage $V_d$:

$$V_s = A \cdot \max(|v_{ix}|) + \Delta$$

Negative supply voltage $V_s$:

$$V_d = -A \cdot \max(|v_{ix}|) - \Delta$$

Figure 5C:
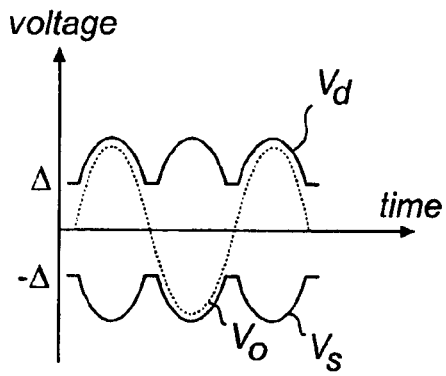
Figure 5D:
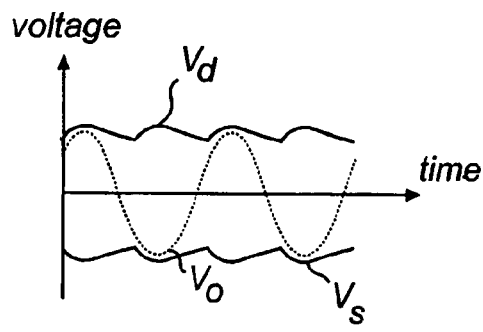

Examples of dual drive voltages, corresponding to the single drive voltages in FIGS. 5a and 5b, are shown in FIGS. 5c and 5d. The switching output voltage $V_o$ is only schematically indicated in the figures.

Figure 6:
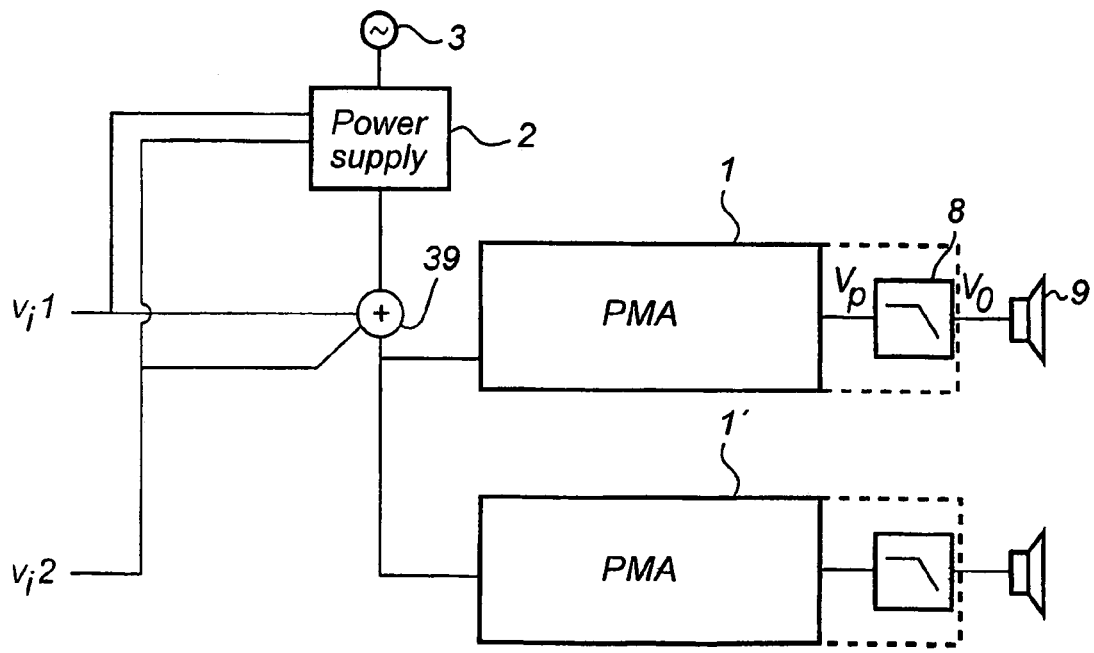
FIG. 6 illustrates a block diagram of a second embodiment of the invention.

FIG. 6 shows a variant of the power converter in FIG. 1, in which the drive voltage signal Vs path from the power supply 4 is used to carry the PMA input voltages $v_{i1}$ and $v_{i2}$, which are signals of weak voltage amplitude. In the illustrated example, the input signals $v_{i1}$ and $v_{i2}$ are simply superimposed on the power supply drive signal in an adding bock 39, and later extracted in the PMA.

The input signals $v_{i1}$, $v_{i2}$ can in principle also be transmitted through the air by any known modulation scheme known to the skilled man. Preferably, the input signals are digital, which will require a digital transmitter and a receiver in the PMA or PMT depending on implementation. Methods from computer networks or ADSL/xDSL communication systems can preferably be utilized, to realize this one wire connection between all channels.

This embodiment of the invention can preferably be used in car applications or multi-channel systems.

Figure 7A:
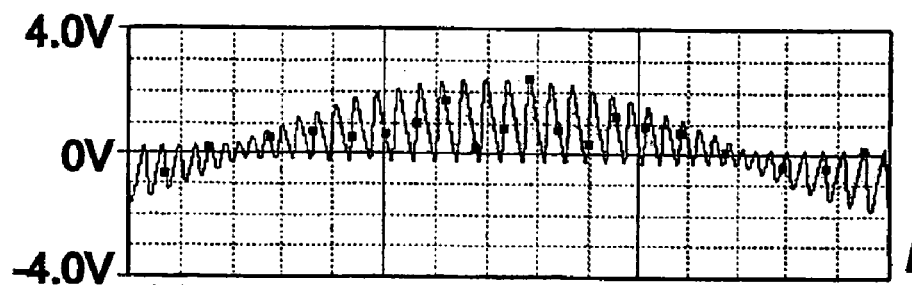
FIG. 7a-7c illustrates a simulation of the system block diagram shown in FIG. 1 with one PMA.
Figure 7B:
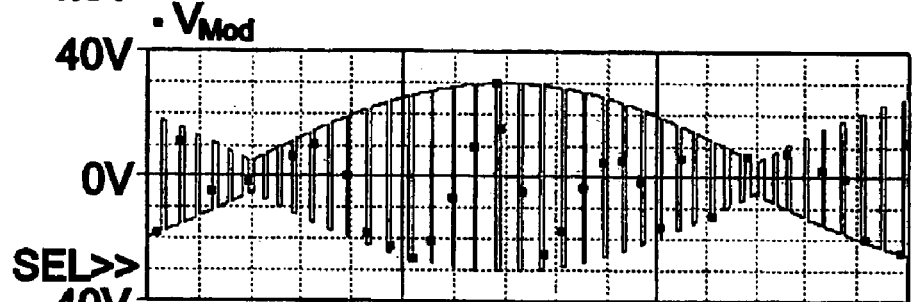
Figure 7C:
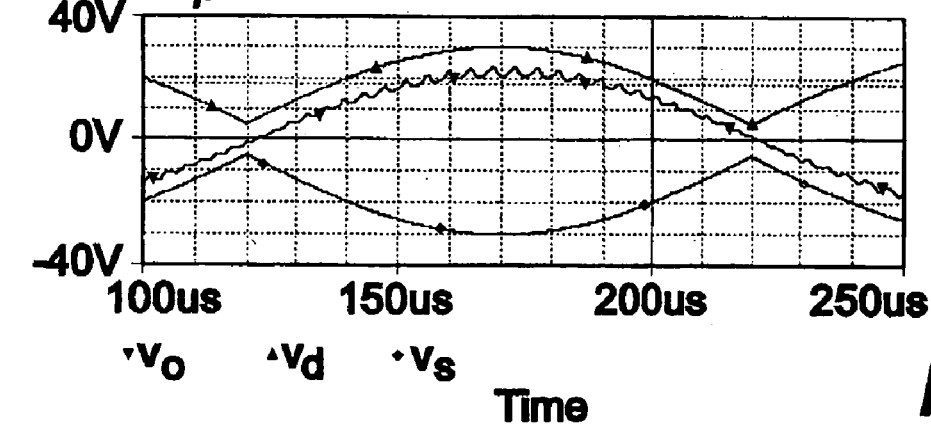

FIG. 7a-c shows a simulation of the system in FIG. 1 with one PMA 1, using COM technology and having a single ended PMA comprising one switching leg operating from dual supplies.

FIG. 7a shows the comparator input signal, $v_{mod}$, and FIG. 7b shows the differential power output from the switching stage, $V_p$. FIG. 7c shows the two parts of the drive voltage, $V_s$ and $V_d$, having a signal shape according to FIG. 5d. FIG. 7c further shows the output voltage of the PMA output filter $V_o$.

It can be seen from FIG. 7a that the comparator input signal $V_{mod}$ varies with the drive voltage amplitude, which is typical for the COM modulation. This implies constant power stage gain in the PMA and will produce a very high power supply rejection ratio as the ratio $V_o/V_{mod}$ is a constant.

Further, FIG. 7b illustrates the characteristics of Pulse Amplitude Width Modulation PAWM according to the invention. Note that in the PAWM the duty cycle is nearly constant. This is due to the predominance of the almost ideal amplitude modulation. When operating a plurality of PMAs from the same power supply the skilled man will see that duty cycle variations can occur in some or all of the PMA's seen over one period of the output signal.

The PMA output signal $V_o$ in FIG. 7c comprises the low frequency signal contributed by the amplitude-modulated signal and the Pulse Width Modulated signal. Furthermore, this voltage signal comprises the high frequency signal residual contributed from the PMA Pulse Width Modulation. The high frequency signal component amplitude is lower (and proportional to the modulation index) compared to traditional two level PWM, which can be seen from FIG. 9, illustrating signals from a prior art power converter, with constant dual drive voltage.

Figure 8A:
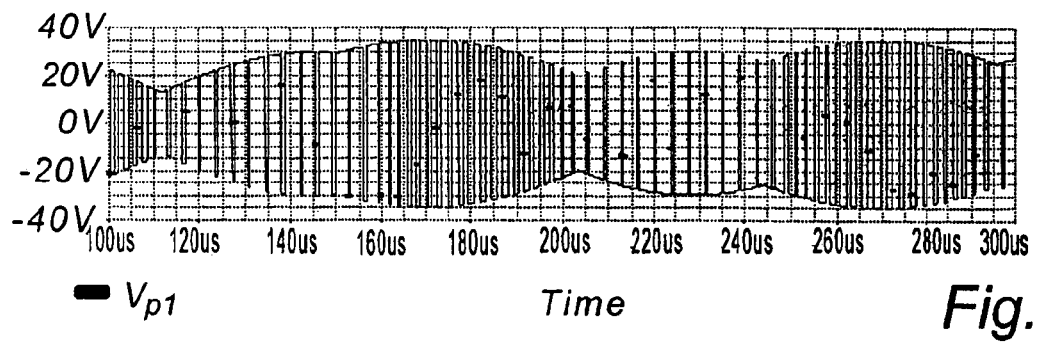
FIG. 8a-8c shows a simulation of the system shown in FIG. 1 with two PMA.
Figure 8B:
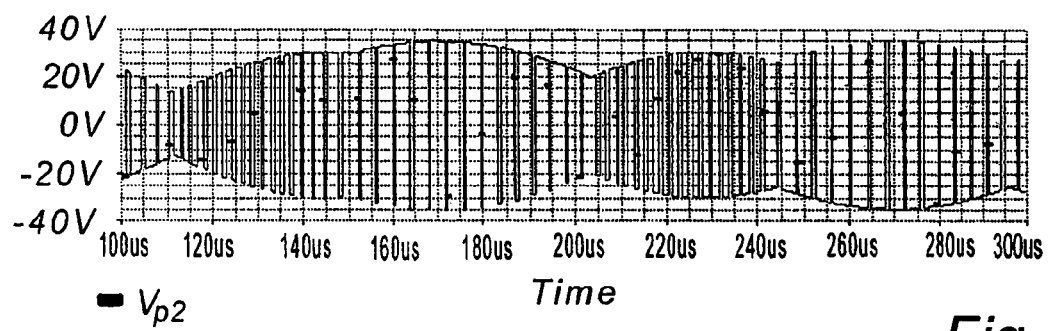
Figure 8C:
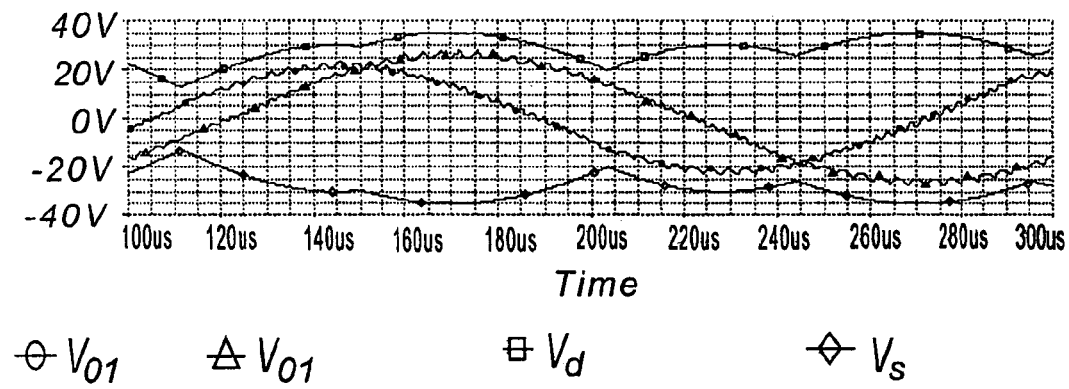

In FIG. 8 a simulation of the system in FIG. 2 as a multi-channel system with two PMAs is shown. The output signals from the switching power stages 7 in the PMA's 1 and 1', $V_{p1}$ and $V_{p2}$, are shown in FIG. 8a and FIG. 8b. The low pass filtered output, $V_{o1}$ and $V_{o2}$, and the two parts of the drive voltage, $V_s$ and $V_d$, are shown in FIG. 8c.

Another preferred embodiment of the invention is shown in FIG. 10, illustrating a PAM system where the PMA is based on a digital PCM-PWM modulator 40 and where a control system 41 is applied to the PMA. The control system 41 can preferably be a PEDEC control system as described in the applicant's patent with international publication number WO98/44626, herewith incorporated by reference. Such a system is capable of obtaining a high PSRR. Other high PSRR feedback system may be applied to digital modulation based PMAs.

Figure 11:
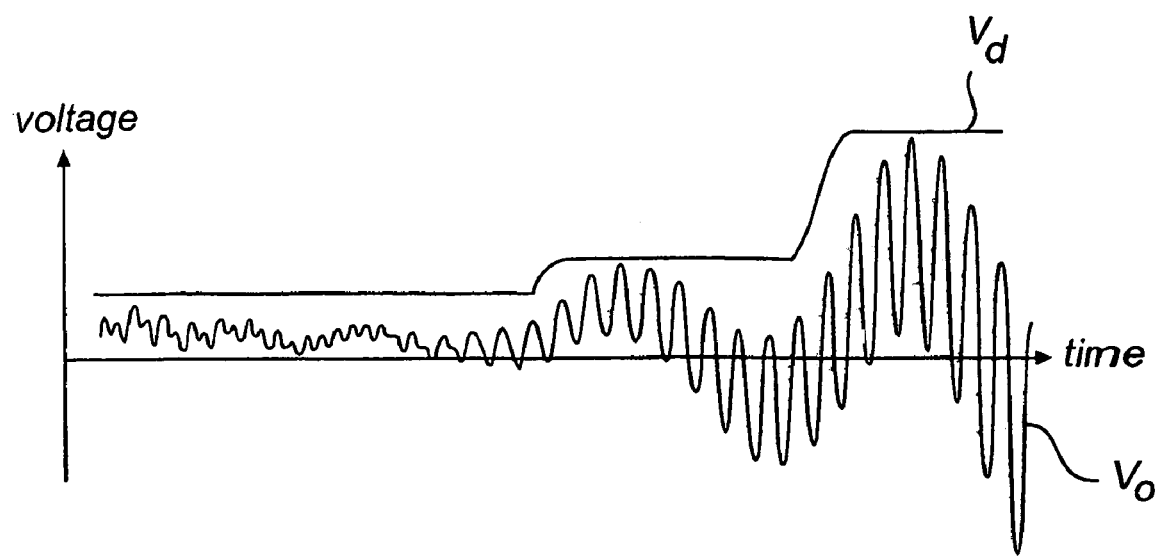
FIG. 11 shows a preferred embodiment as a peak detection modulation of the power supply drive voltage.

Another preferred embodiment is a PAM modulation technique, where the power supply output voltage is controlled by the PMA peak output voltage, to a fixed voltage level within a defined time window. Thus obtaining a peak detection modulation of the power supply output voltage $V_d$. The result of such voltage supply control is illustrated in FIG. 11. $V_d$ is again the drive voltage from the power supply 2, and $V_o$ is the output voltage from the demodulation filter 9. Advantageously, this peak signal detection can be derived from volume control information, which at any time determines the maximal output voltage and hence the maximal required power supply level. The system thus comprises means for providing this information to the voltage supply 2.

Yet another preferred embodiment is a PAM modulation technique, where the power supply output voltage is controlled by the PMA peak output voltage (not shown). The power supply voltage will decrease until a peak detection increases the power supply voltage.

The present invention can advantageously be implemented in any given power conversion system such as AC-AC, DC-DC, DC-AC, AC-DC or any combination of the above mentioned, preferably DC-AC high precision audio power conversion systems, where the power stage elements operates in either "on" or "off" state.

The invention claimed is:

1. A power conversion system comprising:
    at least one Pulse Modulated Amplifier (PMA) (1), including a pulse modulator for generating a pulse modulated signal ($v_{pulse}$) based on a reference input ($v_i$), a switching power stage arranged to amplify the pulse modulated signal, and a control system arranged to compensate for power supply voltage variations, and
    a voltage supply providing a drive voltage ($V_s$, $V_d$) to each amplifier,
    wherein
    said voltage supply is provided with said input reference ($v_i$), and arranged to provide a first drive voltage component ($V_d$) tracking an amplified absolute value of the input reference ($v_i$).

2. A power conversion according to claim 1, wherein the pulse modulator is a pulse width modulator.

3. A power conversion system according to claim 2, wherein the pulse modulator is a Controlled Oscillating Modulator (COM).

4. A power conversion according to claim 2, wherein the pulse modulator is a digital PCM-PWM modulator and where the control system is a Pulse Edge Delay Error Correction (PEDEC) control system arranged to obtain a high PSRR.

5. A power conversion system according to claim 1, wherein the first drive voltage component ($V_d$) is equal to $k*|v_i|+\Delta$, where k is a constant and $\Delta$ is a fixed headroom.

6. A power conversion system according to claim 5, wherein the voltage supply is arranged in such a way that the headroom $\Delta$ increases, when the power supply has to deliver a drive voltage ($V_d$) with a negative $$\frac{dV}{dt}.$$

7. A power conversion system according to claim 1, wherein the first drive voltage component ($V_d$) is controlled by a peak-detection of the output signal ($V_o$) of the PMA, said peak detection preferably generated by volume control information provided to the voltage supply.

8. A power conversion system according to claim 1, wherein the drive voltage ($V_d$) has a maximum and minimum $$\frac{dV}{dt}$$

value of a music signal controlled by the input reference ($v_i$).

9. A power conversion system according to claim 1, wherein the voltage supply further is arranged to deliver a second drive voltage component ($V_s$) equal to the inverse of the first component ($V_d$).

10. A power conversion system according to claim 9, wherein the first and second drive voltage components ($V_s$, $V_d$) have a maximum and minimum $$\frac{dV}{dt}$$

value of a music signal controlled by the input reference ($v_i$).

11. A power conversion system according to claim 1, wherein the voltage supply comprises current sink means.

12. A power conversion system according to claim 1, wherein the input reference ($v_i$) is superimposed on the drive voltage ($V_s$, $V_d$) which is connected to the amplifier(s).

13. A power conversion system according to claim 1, further comprising a low pass filter connected to the switching stage.

14. A power conversion system according to claim 1, directly connected to an electro-dynamic transducer.

15. A power conversion system according to claim 1, where each Pulse modulated amplifier is implemented as a Class D power amplifier.

* * * * *